United States Patent
Yeh

(10) Patent No.: US 9,385,073 B2
(45) Date of Patent: Jul. 5, 2016

(54) PACKAGES HAVING INTEGRATED DEVICES AND METHODS OF FORMING SAME

(71) Applicant: Taiwan Semiconductor Manufacturing Company, Ltd., Hsin-Chu (TW)

(72) Inventor: Chao-Yang Yeh, Luzhou (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/463,396

(22) Filed: Aug. 19, 2014

(65) Prior Publication Data

US 2016/0056100 A1  Feb. 25, 2016

(51) Int. Cl.
| H01L 25/07 | (2006.01) |
| H01L 23/498 | (2006.01) |
| H01L 23/31 | (2006.01) |
| H01L 21/48 | (2006.01) |
| H01L 21/56 | (2006.01) |
| H01L 25/00 | (2006.01) |
| H01L 23/00 | (2006.01) |

(52) U.S. Cl.
CPC ........ H01L 23/49805 (2013.01); H01L 21/486 (2013.01); H01L 21/4853 (2013.01); H01L 21/565 (2013.01); H01L 23/3114 (2013.01); H01L 23/49816 (2013.01); H01L 23/49827 (2013.01); H01L 23/49838 (2013.01); H01L 24/16 (2013.01); H01L 24/81 (2013.01); H01L 25/074 (2013.01); H01L 25/50 (2013.01)

(58) Field of Classification Search
CPC ........... H01L 2224/16198; H01L 2224/16268; H01L 25/071
See application file for complete search history.

(56) References Cited

U.S. PATENT DOCUMENTS

| 5,281,684 A * | 1/1994 | Moore | H01L 24/11 205/125 |
| 2005/0212134 A1* | 9/2005 | Pu | H01L 23/642 257/738 |
| 2006/0158863 A1* | 7/2006 | Hsu | H01L 23/49816 361/760 |
| 2008/0142961 A1* | 6/2008 | Jones | H01L 25/165 257/724 |

* cited by examiner

*Primary Examiner* — Stephen W Smoot
(74) *Attorney, Agent, or Firm* — Slater Matsil, LLP

(57) ABSTRACT

An embodiment device package includes a discrete device, a first connector on a bottom surface of the discrete device, and a second connector on a top surface of the discrete device. The first connector bonds the discrete device to a first package component, and the second connector bonds the discrete device to a second package component.

20 Claims, 14 Drawing Sheets

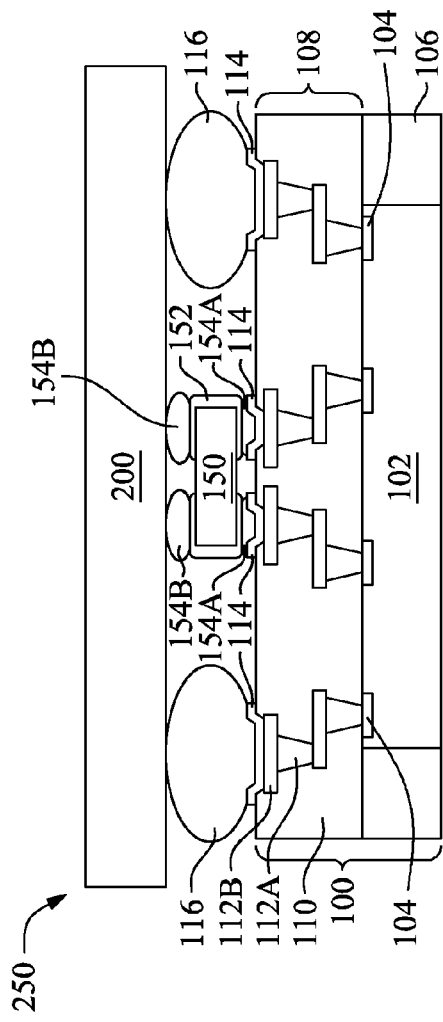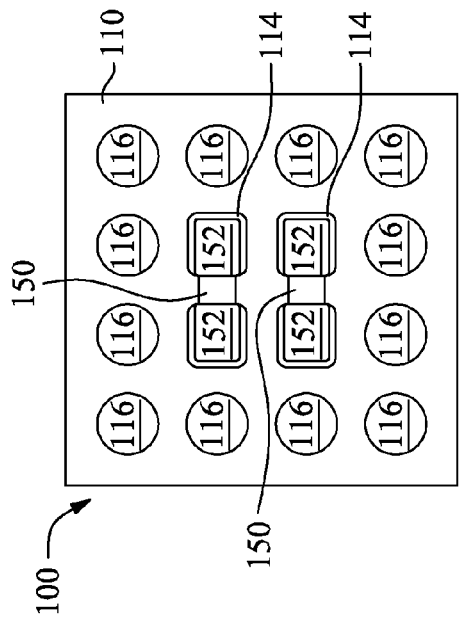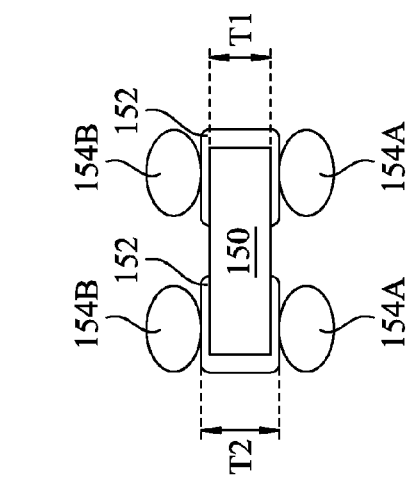

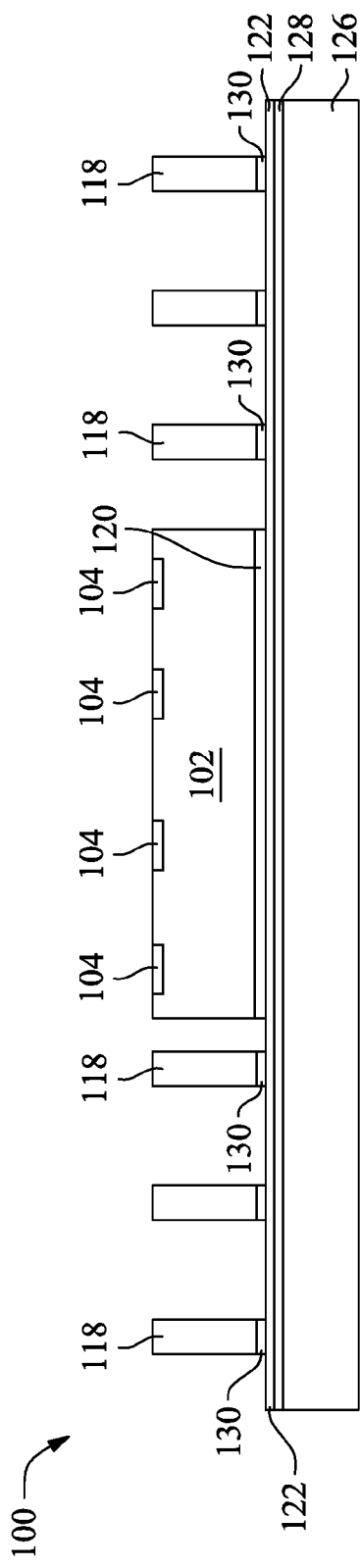
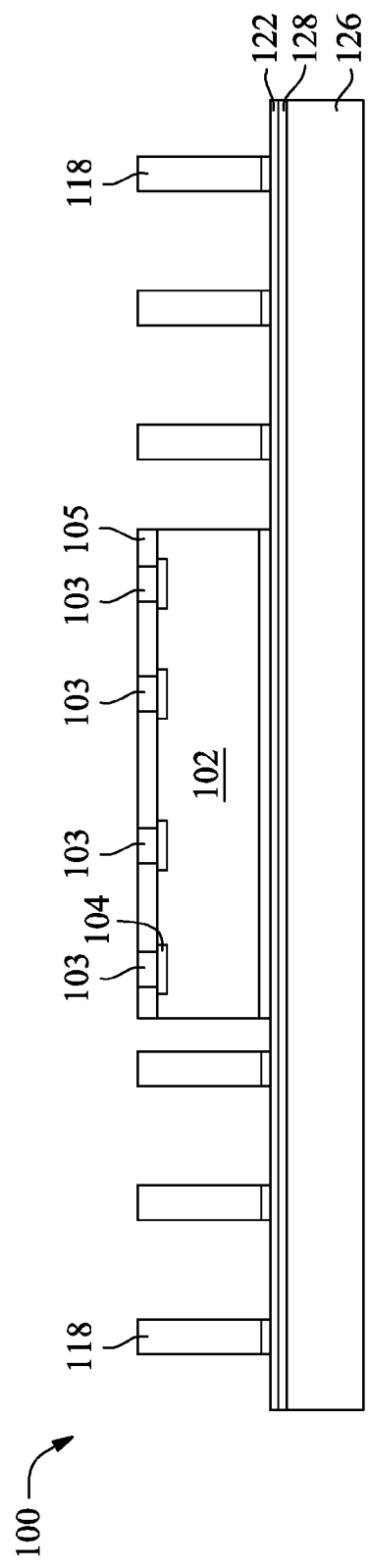

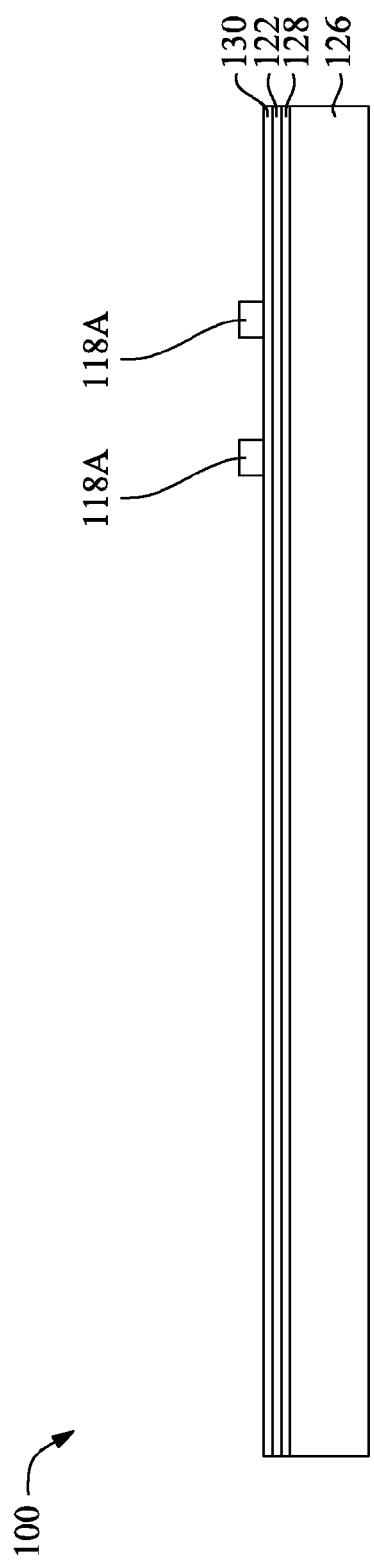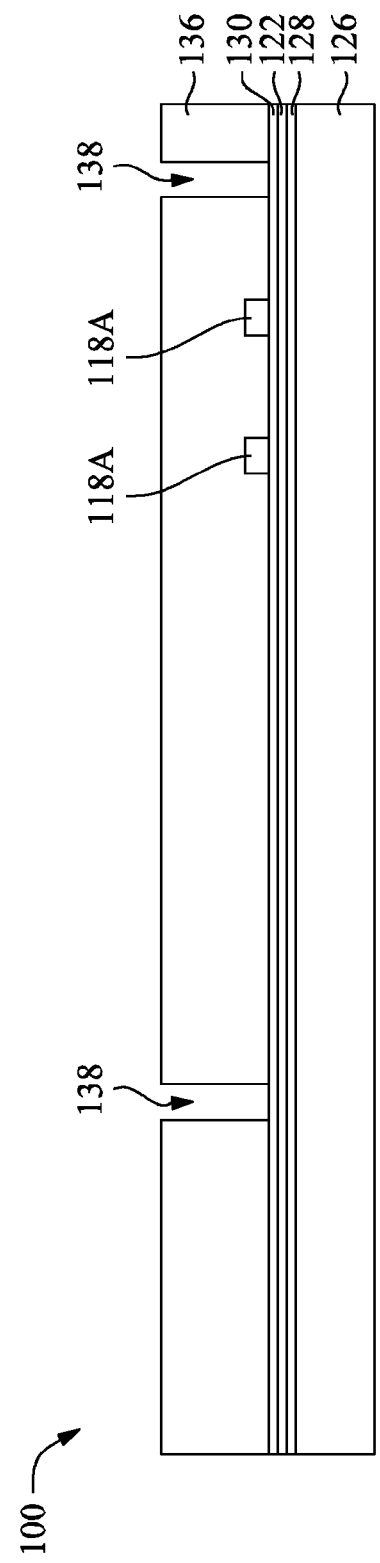

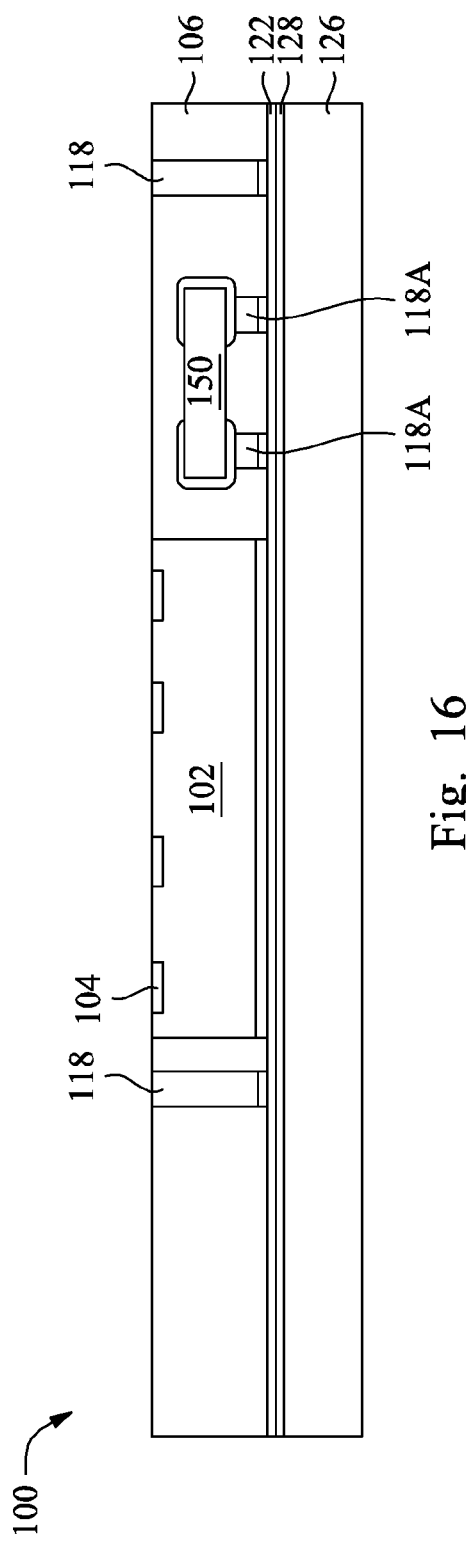
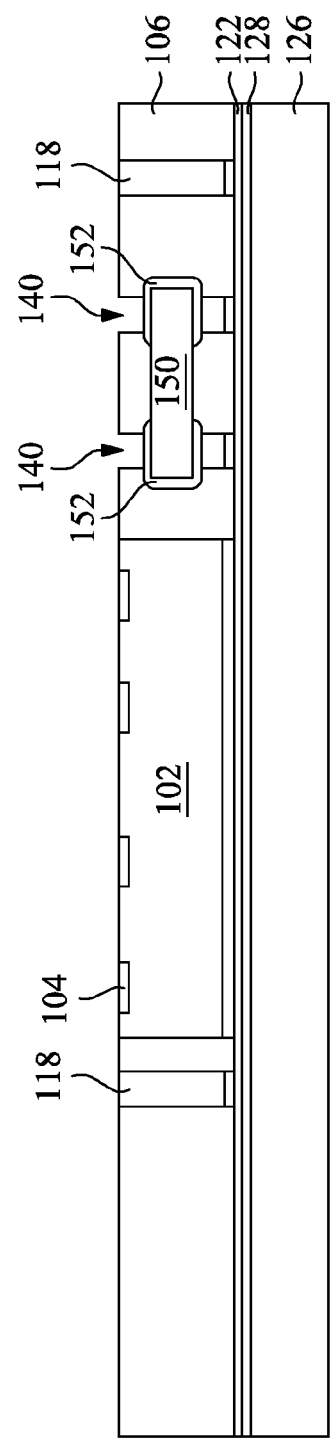
Fig. 16
Fig. 17

PACKAGES HAVING INTEGRATED DEVICES AND METHODS OF FORMING SAME

BACKGROUND

In an aspect of conventional packaging technologies, such as wafer level packaging (WLP), redistribution layers (RDLs) may be formed over a die and electrically connected to active devices in the die. External input/output (I/O) pads such as solder balls on under-bump metallurgy (UBMs) may then be formed to electrically connect to the die through the RDLs. An advantageous feature of this packaging technology is the possibility of forming fan-out packages. Thus, the I/O pads on a die can be redistributed to a greater area than the die, and hence the number of I/O pads packed on the surfaces of the dies can be increased.

In such packaging technologies, external I/O pads and discrete devices (sometimes referred to as surface mount devices (SMDs)) may be disposed over and electrically connected to the RDLs. The external I/O pads may electrically connect the package to another package component, such as, a device package, a package substrate, and interposer, and the like.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A through 1C illustrate varying views of a semiconductor device package in accordance with some embodiments.

FIGS. 3 through 5A-5B and 6 through 10 illustrate a cross sectional views of various intermediary stages of manufacturing a semiconductor device package in accordance with some embodiments.

FIG. 12 through 20 illustrate a cross sectional views of various intermediary stages of manufacturing a semiconductor device package in accordance with some embodiments.

DETAILED DESCRIPTION

Figure 2:
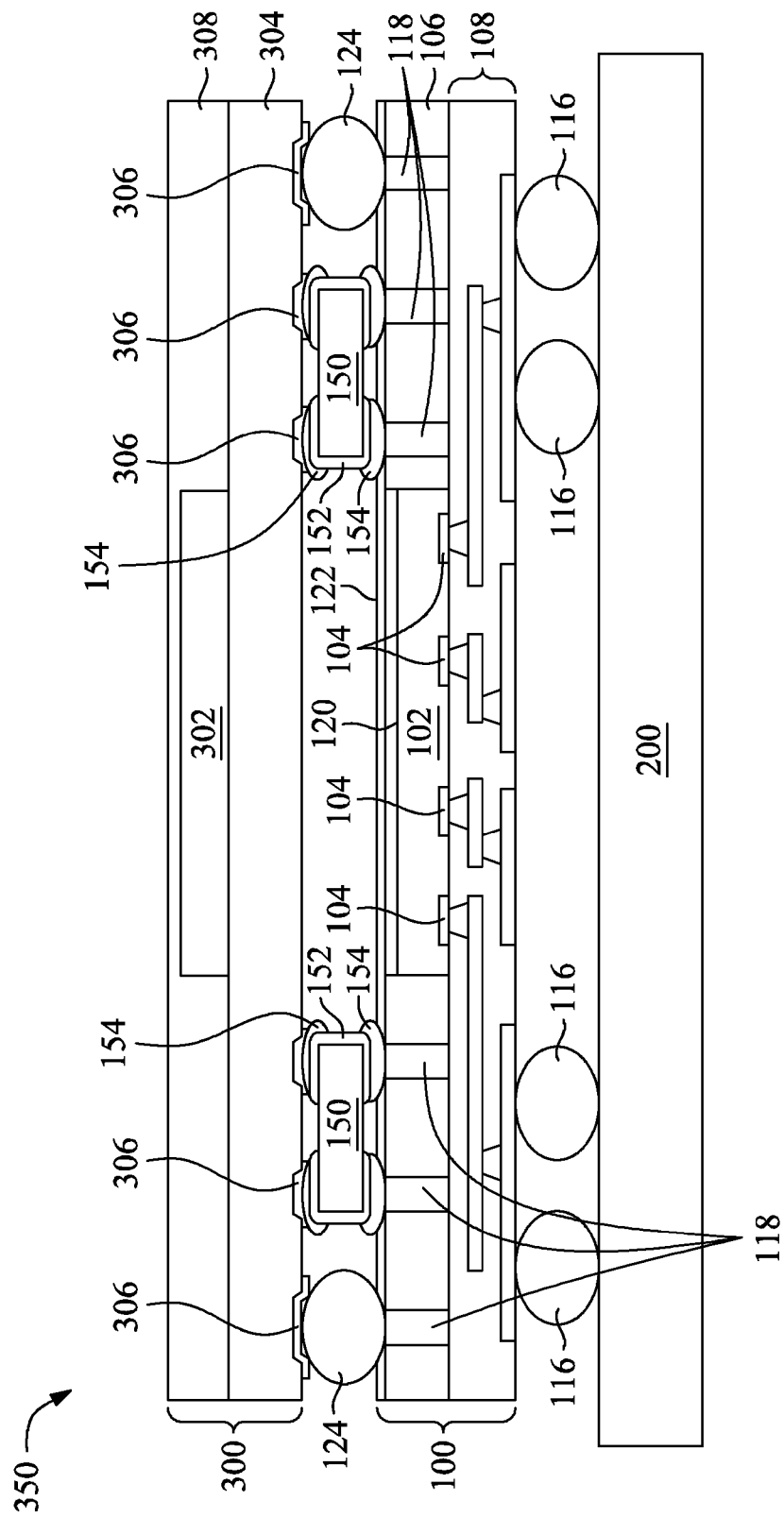
FIG. 2 illustrates a cross sectional view of a semiconductor device package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Before addressing the illustrated embodiments specifically, certain advantageous features and aspects of the present disclosed embodiments will be addressed generally. Described below are various semiconductor device packages having discrete devices (sometimes referred to as surface mount devices (SMDs) or integrated devices) and methods for forming such device packages. In some embodiments, connectors may be formed on both a top and bottom surface of the discrete devices, which may be used to bond and/or electrically connect the discrete devices to package components disposed above and below the discrete devices. In such embodiments, the discrete devices may be used as interconnect structures, thermal conductivity paths, structural supports, and/or the like to improve thermal, power, structural, and/or electrical functions of the resulting device package.

FIG. 1A illustrates a cross-sectional view of a semiconductor device package 250 in accordance with various embodiments. Package 250 may include a bottom fan-out package 100, which includes a die 102, a molding compound 106 disposed around die 102, and redistribution layers (RDLs) 108 (e.g., having conductive features 112A and 112B) formed over die 102 and molding compound 106. RDLs 108 may extend laterally past edges of die 102, and redistribute input/output (I/O) pads of the die to a larger surface area than the die to form a fan-out package.

Die 102 may be a semiconductor die and could be any type of integrated circuit, such as a processor, logic circuitry, memory, analog circuit, digital circuit, mixed signal, and the like. Die 102 may include a substrate, active devices, and an interconnect structure (not individually illustrated). The substrate may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Active devices such as transistors, capacitors, resistors, diodes, photo-diodes, fuses, and the like may be formed at the top surface of the substrate. An interconnect structure may be formed over the active devices and the substrate. The interconnect structure may include inter-layer dielectric (ILD) and/or inter-metal dielectric (IMD) layers containing conductive features (e.g., conductive lines and vias comprising copper, aluminum, tungsten, combinations thereof, and the like)

formed using any suitable method. The ILD and IMDs may include low-k dielectric materials having k values, for example, lower than about 4.0 or even 2.0 disposed between such conductive features. In some embodiments, the ILD and IMDs may be made of, for example, phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, formed by any suitable method, such as spinning, chemical vapor deposition (CVD), and plasma-enhanced CVD (PECVD). The interconnect structure electrically connects various active devices to form functional circuits within die 102. The functions provided by such circuits may include memory structures, processing structures, sensors, amplifiers, power distribution, input/output circuitry, or the like. One of ordinary skill in the art will appreciate that the above examples are provided for illustrative purposes only to further explain applications of the present invention and are not meant to limit the present invention in any manner. Other circuitry may be used as appropriate for a given application.

I/O and passivation features may be formed over the interconnect structure. For example, contact pads 104 may be formed over the interconnect structure and may be electrically connected to the active devices through the various conductive features in the interconnect structure. Contact pads 104 may comprise a conductive material such as aluminum, copper, and the like. Furthermore, a passivation layer may be formed over the interconnect structure and the contact pads. In some embodiments, the passivation layer (not separately illustrated) may be formed of non-organic materials such as silicon oxide, un-doped silicate glass, silicon oxynitride, and the like. Other suitable passivation materials may also be used. Portions of the passivation layer may cover edge portions of contact pads 104.

Additional interconnect features, such as additional passivation layers, conductive pillars, and/or under bump metallurgy (UBM) layers, may also be optionally formed over contact pads 104. For example, a passivation layer 105 (e.g., a polymer) having conductive pillars 103 may be formed over contact pads 104 (see e.g., FIG. 5B), and the conductive pillars 103 may electrically connect to contact pads 104. The various features of die 102 may be formed by any suitable method and are not described in further detail herein. Furthermore, the general features and configuration of die 102 described above are but one example embodiment, and die 102 may include any combination of any number of the above features as well as other features.

Molding compound 106 is disposed around die 102. For example, in a top down view of molding compound 106/die 102 (not illustrated), molding compound 106 may encircle die 102. One or more RDLs 108 may be formed over die 102 and molding compound 106. RDLs 108 may extend laterally past edges of die 102 to provide fan-out interconnect structures. RDLs 108 may include one or more polymer layers 110 comprising polyimide (PI), polybenzoxazole (PBO), benzocyclobuten (BCB), epoxy, silicone, acrylates, nano-filled pheno resin, siloxane, a fluorinated polymer, polynorbornene, and the like. RDLs 108 may further include conductive features 112 (e.g., conductive lines 112B and conductive vias 112A) formed in the one or more polymer layers 110.

Additional package features, such as external connectors 116 may be disposed over RDLs 108. Connectors 116 may be ball grid array (BGA) balls, controlled collapse chip connector (C4) bumps, microbumps, and the like disposed on under metal metallurgies (UBMs) 114, which may be formed over RDLs 108. Connectors 116 may be electrically connected to die 102 by way of RDLs 108. Connectors 116 may be used to electrically connect package 100 to another package component 200. In some embodiments package component 200 may be another device die, an interposer, a package substrate, a printed circuit board, and the like.

Furthermore, one or more discrete devices 150 may be disposed between and bonded to package 100 and package component 200. Discrete device 150 may be disposed between or even surrounded by connectors 116 also disposed on the top surface of RDLs 108 (see e.g., a top down view of package 100 illustrated in FIG. 1C). Discrete device 150 may be bonded to UBMs 114 on package 100 as well as to a bottom surface of package component 200 using connectors 154A and 154B, which may be disposed on top and bottom surfaces of discrete device 150, respectively. By using connectors 154A and 154B to bond to both package 100 and package component 200, discrete device 150 may be used as a structural support, power signal path, electrical signal path, thermal conductivity path, and the like, thus improving the electrical, structural, and/or thermal integrity/performance of the resulting device package 250.

FIG. 1B illustrates a detailed cross sectional view of discrete device 150. In some embodiments, discrete devices 150 may be passive device dies, such as a RLC circuit, a capacitor chip, and the like. Discrete device 150 may be substantially free of transistors, for example. Other types of discrete devices may also be employed.

Discrete device 150 may include contact pads 152 disposed on top, bottom, and sidewall surfaces of discrete device 150. In the illustrated embodiment, contact pads 152 may encapsulate end portions of discrete device 150. For example, each contact pads 152 may provide direct electrical/thermal connection from the top surface to the bottom surface of discrete device 150. Connectors 154A and 154B may be disposed on contact pads 152, and each contact pad 152 may electrically connect a connector 154B on a top surface of discrete device 150 to a corresponding connector 154A on the bottom surface of discrete device 150. Alternatively, connector 154A may be electrically connected to connector 154B by interconnect structures within discrete device 150. Connectors 154A/154B may be solder balls, such as, BGA balls, C4 bumps, microbumps, and the like.

Referring back to FIG. 1A, because discrete device 150 and connectors 154A/154B fill a gap between package 100 and package component 200, relatively larger discrete devices may be employed to provide an appropriate vertical dimension. For example, a vertical dimension T1 of discrete device 150 (without contact pads 152) may be about 70 μm to about 180 μm, and a vertical dimension T2 of discrete device 150 (with contact pads 152) may be about 80 μm to about 200 μm. Thus, the costs of providing discrete devices may be reduced because larger technology node devices may be used. Discrete devices having other dimensions may also be used in alternative embodiments depending on package design.

FIG. 2 illustrates a cross-sectional view of a semiconductor device package 350 in accordance with various alternative embodiments. Package 350 may be similar to package 250 where like reference numerals indicate like elements. However, package 350 may include a package-on-package (PoP) configuration where a second package 300 is bonded to package 100. Package 300 may include one or more dies 302 bonded to a package substrate 304, and die 302 may be encased a molding compound 308. In some embodiments, package 300 may be a dynamic random access memory (DRAM) package, a wide input/output (WIO) package, or the like. For example, referring to FIG. 20, package 300 may include stacked DRAM dies 302 wire bonded to a package substrate 304, which may include conductive through vias 310 extending therethrough. Other package configurations (e.g., a configuration similar to package 100 or any other suitable configuration) may be used in alternative embodiments.

Package 300 may be bonded to an opposing side of package 100 as RDLs 108 using connectors 124 (e.g., BGA balls, C4 bumps, microbumps, and the like). Furthermore, discrete devices 150 may be disposed between and bonded to both packages 100 and 300 using connectors 154A/154B disposed on a bottom and top surface of discrete devices 150, respectively. Connectors 124 and 154B may be bonded to UBMs 306 of package 300. Discrete devices 150 may or may not be electrically connected to package 300.

Conductive vias 118 extend through molding compound 106 and provide electrical connection between package 300/discrete devices 150 and RDLs 108, which may electrically connect such package components to die 102. For example, connectors 124 and 154A may be disposed in openings in a passivation layer 122 and bonded to conductive vias 118. Other connector elements (not illustrated), such as UBMs, contact pads, and the like, may be disposed between connectors 124/154A and conductive vias 118. In some embodiments, passivation layer 122 covers a surface of package 100, and an adhesive layer 120 may be used to bond a backside of die 102 to passivation layer 122.

Figure 3:
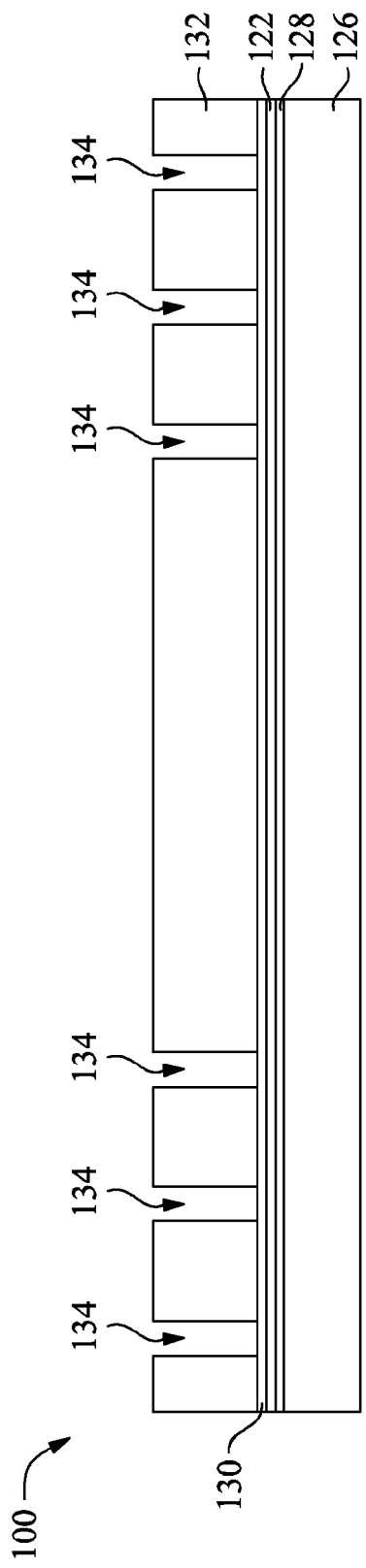
Figure 4:
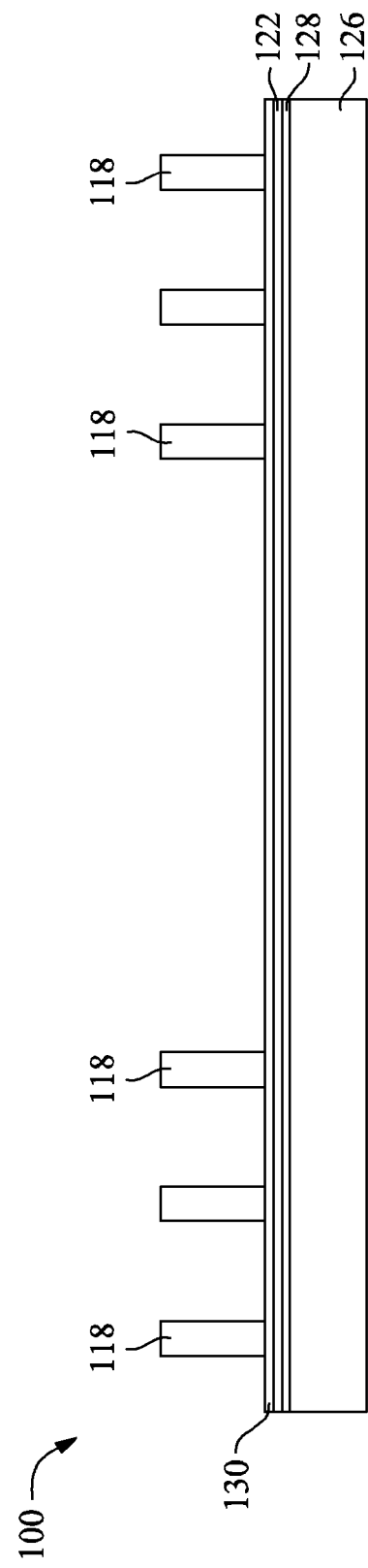

FIGS. 3 through 10 illustrate various intermediary steps of manufacturing a semiconductor device package (e.g., package 350) in accordance with some embodiments. Referring first to FIGS. 3 and 4, conductive vias 118 are formed over a carrier substrate 126. In FIG. 3, various device layers are formed over carrier substrate 126. Generally, the carrier substrate 126 provides temporary mechanical and structural support to die 102 during subsequent processing steps. In this manner, damage to die 102 is reduced or prevented. Carrier substrate 126 may comprise, for example, glass, silicon oxide, aluminum oxide, and the like. A temporary adhesive layer 128 (e.g., a glue layer, a light-to-heat conversion (LTHC) coating, an ultraviolet (UV) film, and the like) is disposed over carrier substrate 126, and passivation layer 122 may be formed over adhesive layer 128. In some embodiments, passivation layer 122 may comprise a polymer, such as, PI, PBO, BCB, epoxy, silicone, acrylates, nano-filled pheno resin, siloxane, a fluorinated polymer, polynorbornene, and the like formed using any suitable means such as spin-on techniques, and the like. Subsequently, a conductive seed layer 130 (e.g., comprising copper, copper, silver, gold, and the like) may be formed over passivation layer 122 using a suitable method, such as, chemical vapor deposition (CVD), sputtering, and the like.

As further illustrated by FIG. 3, a patterned photoresist 132 may be formed over seed layer 130. For example, photoresist 132 may be deposited as a blanket layer over seed layer 130. Next, portions of photoresist 132 may be exposed using a photo mask (not shown). Exposed or unexposed portions of photoresist 132 are then removed depending on whether a negative or positive resist is used. The resulting patterned photoresist 132 may include openings 134, which may be disposed at peripheral areas of carrier substrate 126. Openings 134 may further expose seed layer 130.

FIG. 4 illustrates the filling of openings 134 with a conductive material such as copper, silver, gold, and the like to form conductive vias 118. The filling of openings 134 may include electro-chemically plating openings 134 with a conductive material. The conductive material may overfill openings 134, and a planarization process (e.g., a chemical mechanical polish (CMP)) may be performed to remove excess portions of the conductive material over photoresist 132. Subsequently, photoresist 132 may be removed using, for example, a plasma ashing or wet strip process. Optionally, the plasma ashing process may be followed by a wet dip in a sulfuric acid ($H_2SO_4$) solution to clean package 100 and remove remaining photoresist material.

Next in FIGS. 5A and 5B, seed layer 130 is patterned to remove portions of seed layer 130 not covered by conductive vias 118. The patterning of seed layer 130 may include a combination of photolithography and etching processes, for example. The resulting conductive via 118 over a remaining portion of seed layer 130 may be referred to hereinafter simply as conductive via 118 for brevity. Subsequently, as further illustrated by FIGS. 5A and 5B, die 102 is placed in an opening between conductive vias 118. For example, die 102 may be attached to passivation layer 122 by adhesive layer 120 (e.g., a DAF) disposed on a backside of die 102. Conductive vias 118 may have a top surface substantially level or higher than a top surface of die 102.

Although FIG. 5A illustrates contact pads 104 exposed on the top surface of die 102, other features may be formed over contact pads 104 in other embodiments. For example, FIG. 5B illustrates an embodiment having conductive pillars 103 (e.g., comprising copper) disposed on and electrically connected to contact pads 104. A passivation layer 105 (e.g., comprising a polymer) may further be disposed between conductive pillars 103. In such embodiments, conductive pillars 103 and passivation layer 105 may function as protection layers during the formation of various other features in the device package. Other features may also be formed in addition to or in lieu of conductive pillars 103/passivation layer 105 over contact pads 104 depending on device design.

Figure 6:
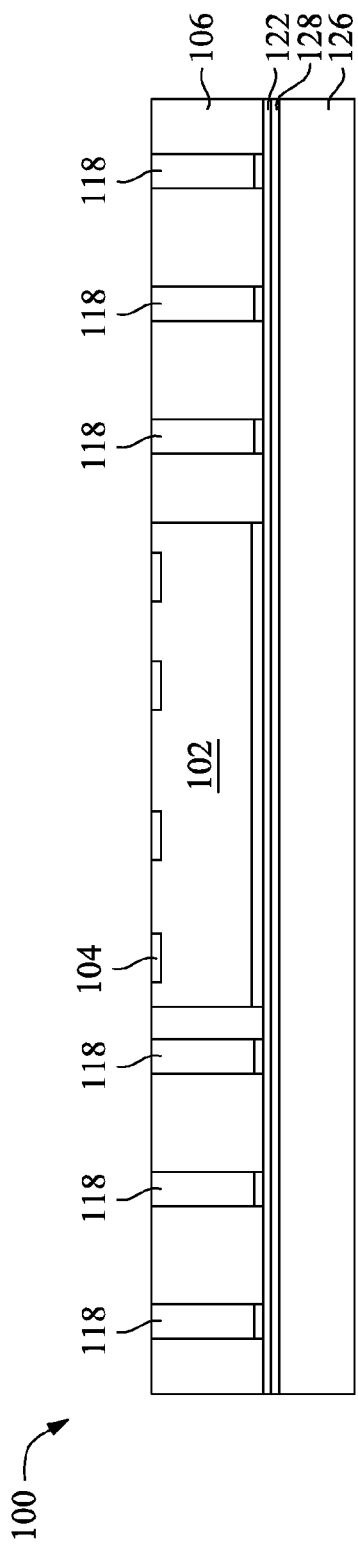

FIG. 6 illustrates the formation of molding compound 106 between die 102 and conductive vias 118. Molding compound 106 may include any suitable material such as an epoxy resin, a molding underfill, and the like. Suitable methods for forming molding compound 106 may include compressive molding, transfer molding, liquid encapsulent molding, and the like. For example, molding compound 106 may be dispensed between die 102/conductive vias 118 in liquid form. Subsequently, a curing process is performed to solidify molding compound 106. The filling of molding compound 106 may overflow die 102 and conductive vias 118 so that molding compound 106 covers top surfaces of die 102 and conductive vias 118. Subsequently, a planarization (e.g., CMP or other etch back technique) may be performed to expose die 102 and conductive vias 118. After planarization, top surfaces of molding compound 106, die 102, and conductive vias 118 may be substantially level.

Figure 7:
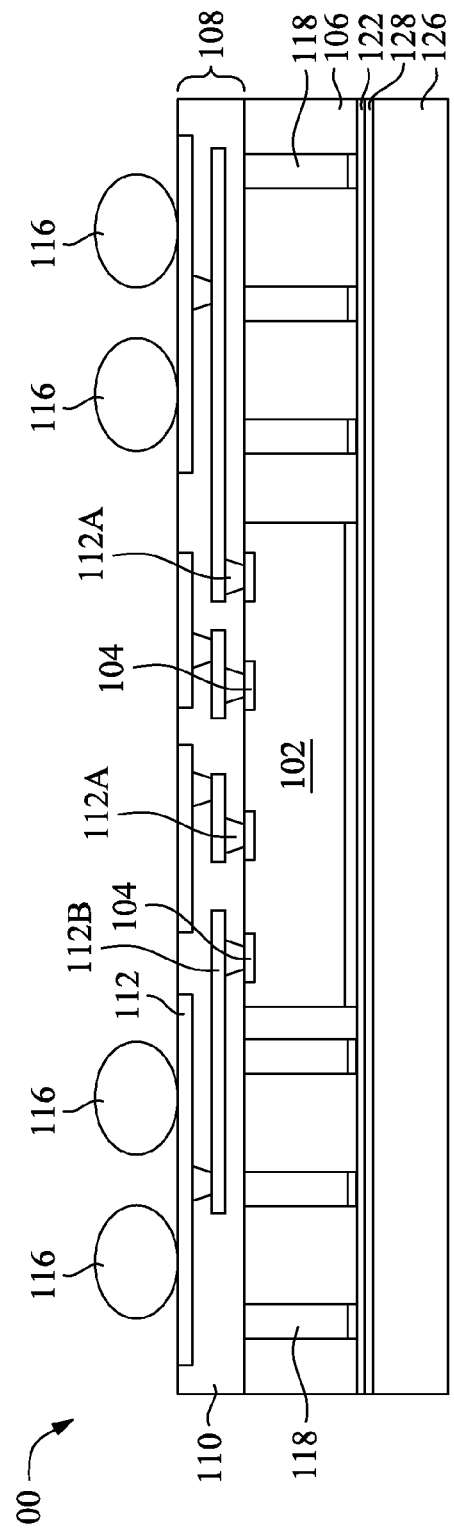

FIG. 7 illustrates the formation of one or more RDLs 108 and connectors 116 over die 102, molding compound 106, and conductive vias 118. RDLs 108 (e.g., having conductive features 112 disposed in one or more polymer layers 110) may be formed using any suitable method. For example, a first polymer layer 110 may be blanket deposited over top surfaces of die 102, molding compound 106, and conductive vias 118 using a spin-on coating process, sputtering, and the like. The first polymer layer 110 may comprise PI, PBO, BCB, epoxy, silicone, acrylates, nano-filled pheno resin, siloxane, a fluorinated polymer, polynorbornene, and the like. After deposition, the first polymer layer 110 may be patterned to include openings using photolithography and/or etching processes, for example. Openings in the first polymer layer 110 may expose conductive vias 118 and conductive features on a top surface of dies 102.

Subsequently, the openings in the first patterned polymer layer 110 may be filled with a conductive material. For example, a seed layer (not shown) may be formed in the openings and a conductive material may be electro-chemically plated in the openings. Thus, various conductive vias 112A may be formed in a first polymer layer 110, and such vias may be electrically connected to die 102 and/or conductive vias 118. Conductive lines 112B may be formed over the first polymer layer by using a mask to define a shape of conductive lines 112B, depositing a seed layer in the mask, electro-chemically plating a conductive material in the mask, and removing the mask. Additional polymer layers 110 may then be formed over the first polymer layer 110 and such conductive lines 112B, and additional conductive features 112 may be formed in these additional polymer layers 110 using similar processes.

As also illustrated by FIG. 7, other package features, such as external connectors 116 may be formed over RDLs 108. Connectors 116 may be BGA balls, C4 bumps, microbumps, and the like disposed on UBMs (e.g., UBMs 114 of FIG. 1A), which may be formed over RDLs 108. Connectors 116 may be electrically connected to dies 102 and conductive vias 118 by way of RDLs 108. Connectors 116 may be used to electrically connect package 100 to another package component 200 (see e.g., FIG. 2).

Figure 8:
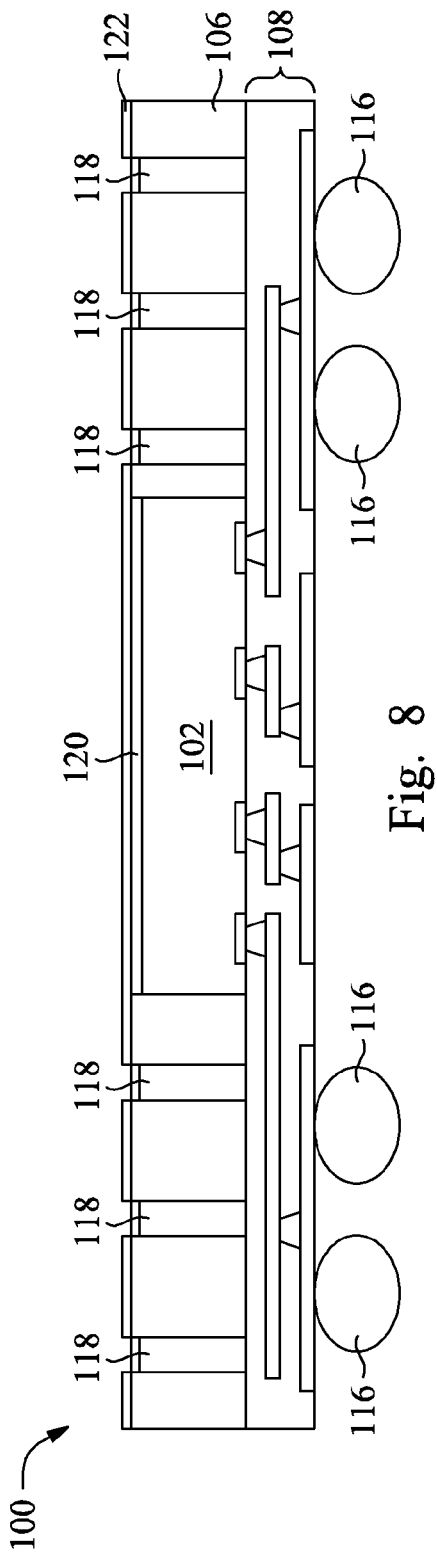

In FIG. 8, package 100 may be removed from carrier substrate 126 by removing temporary adhesive layer 128. The removal process of adhesive layer 128 may include applying heat to a LTHC layer, exposing an UV tape to UV light, and the like. The orientation of package 100 may then be flipped. For example, the backside of die 102 may be oriented upwards and passivation layer 122 may be disposed on the top surface of package 100. Subsequently, passivation layer 122 is patterned to expose conductive vias 118 using a suitable process such as laser etching, photolithography, and/or etching, for example.

Figure 9:
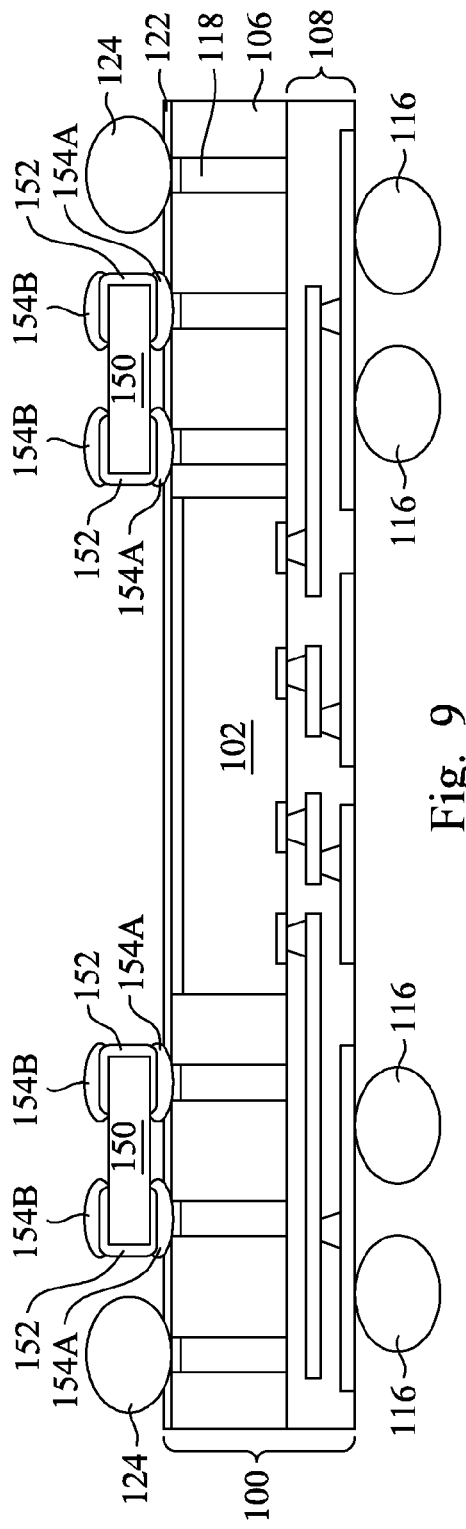

Next, in FIG. 9, connectors 124 and 154A may be disposed in openings of passivation layer 122. Connectors 124 and 154A may be electrically connected to RDLs 108 by conductive vias 118. As further illustrated by FIG. 10, connectors 154A may bond discrete devices 150 to package 100. For example, connectors 154A may be bonded to a bottom surface of contact pads 152 on discrete devices 150. Subsequently, additional connectors 154B may be disposed on a top surface of discrete devices 150 (e.g., on a top surface of contact pads 152). In some embodiments, each contact pads 152 may electrically connect a connector 154B on the top surface of discrete device 150 to a corresponding connector 154A on the bottom surface of discrete device 150. In other embodiments, top and bottom connectors 154A and 154B may be electrically connected by interconnect structures (not shown) within discrete devices 150.

Figure 10:
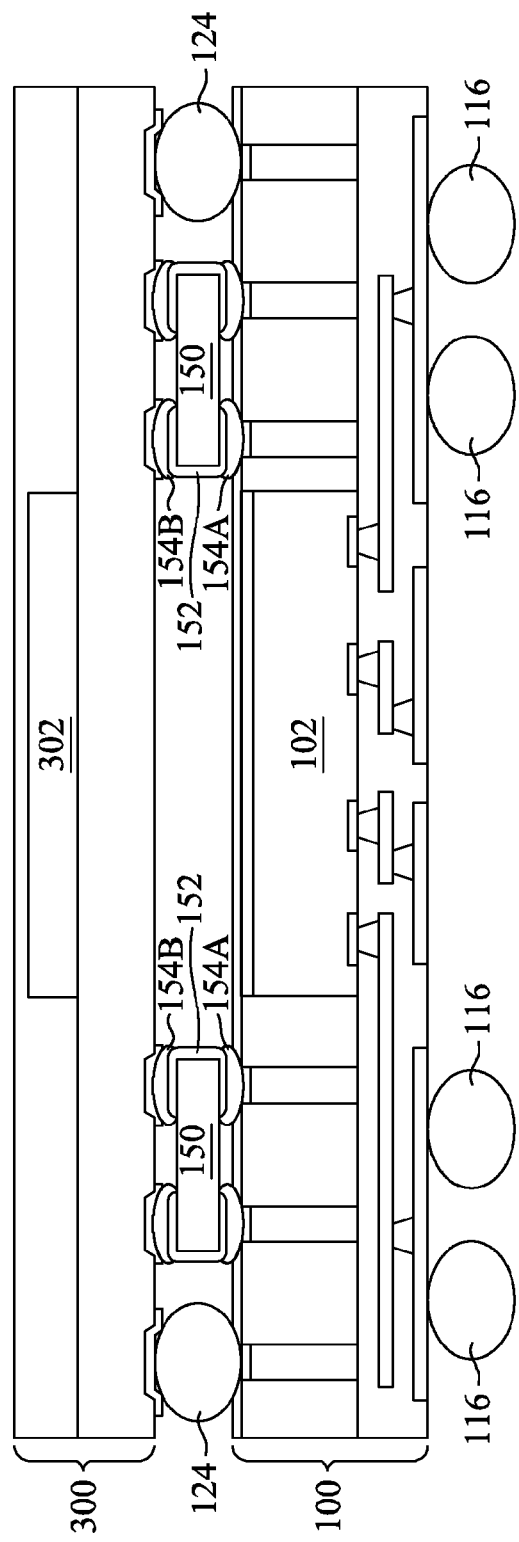

In FIG. 10, another device package 300 is bonded to connectors 125 and 154B (e.g., by performing a reflow). Discrete devices 150 are bonded to both packages 100 and 300, and may be used as a structural support and/or thermal conductivity path for improved device performance. Furthermore, discrete devices 150 may or may not be electrically connected to device dies (e.g., die 302) in package 300. In embodiments where discrete devices 150 are electrically connected to package 300, discrete devices 150 may further act as power and/or electrical signal paths between packages 100 and 300.

Figure 11:
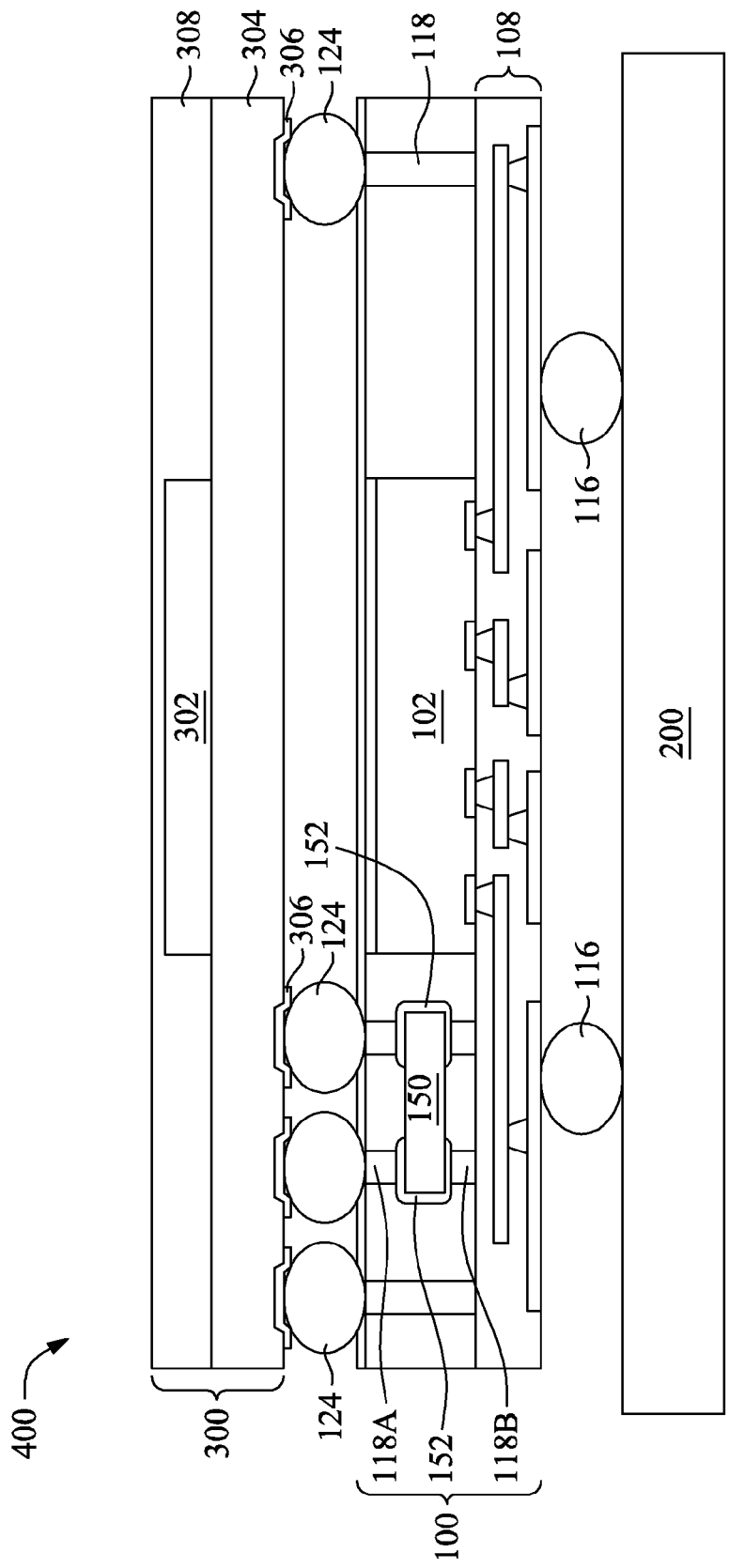
FIG. 11 illustrates a cross sectional view of a semiconductor device package in accordance with some embodiments.

FIG. 11 illustrates a cross-sectional view of a semiconductor device package 400 in accordance with various alternative embodiments. Package 400 may be similar to package 350 where like reference numerals indicate like elements. Package 400 may include discrete devices 150 disposed within molding compound 106. Conductive vias 118A and 118B maybe formed on contact pads 152 of discrete devices 150. In package 400, a combination of conductive vias 118A, 118B, and discrete device 150 may provide electrical connection between features a frontside of package 100 (e.g., RDLs 108) to features on a backside of package 100 (e.g., connectors 124/package 300).

Figure 14:
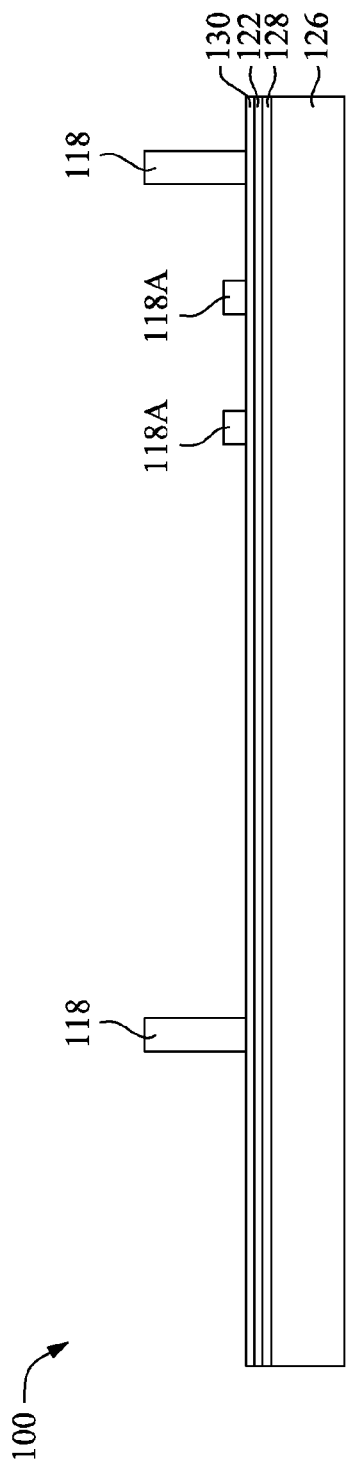

FIGS. 12 through 20 illustrate various intermediary steps of manufacturing a semiconductor device package (e.g., package 400) in accordance with some embodiments. Referring first to FIGS. 12 through 14, conductive vias 118 and 118A are formed over carrier substrate 126. In FIG. 12, conductive vias 118A are formed over seed layer 130, passivation layer 122, and carrier substrate 126 using a substantially similar process as that described with respect to FIGS. 3 and 4, for example. Next as illustrated by FIG. 13, a patterned photoresist 136 may be formed over seed layer 130. Photoresist 136 may include openings 138, which may expose portions of seed layer 130. Photoresist 136 may further mask conductive vias 118A, and photoresist 136 may have a top surface that is higher than top surfaces of conductive vias 118A.

FIG. 14 illustrates the filling of openings 138 with a conductive material such as copper, silver, gold, and the like to form conductive vias 118 using a suitable method, such as electro-chemical plating. Conductive vias 118 may have a vertical dimension that is greater than a vertical dimension of conductive vias 118A. For example, in the orientation illustrated in FIG. 14, top surfaces of conductive vias 118 may be higher than top surfaces of conductive vias 118A. Photoresist 136 may be removed using, for example, a plasma ashing or wet strip process. Optionally, the plasma ashing process may be followed by a wet dip in a sulfuric acid ($H_2SO_4$) solution to clean package 100 and remove remaining photoresist material.

Figure 15:
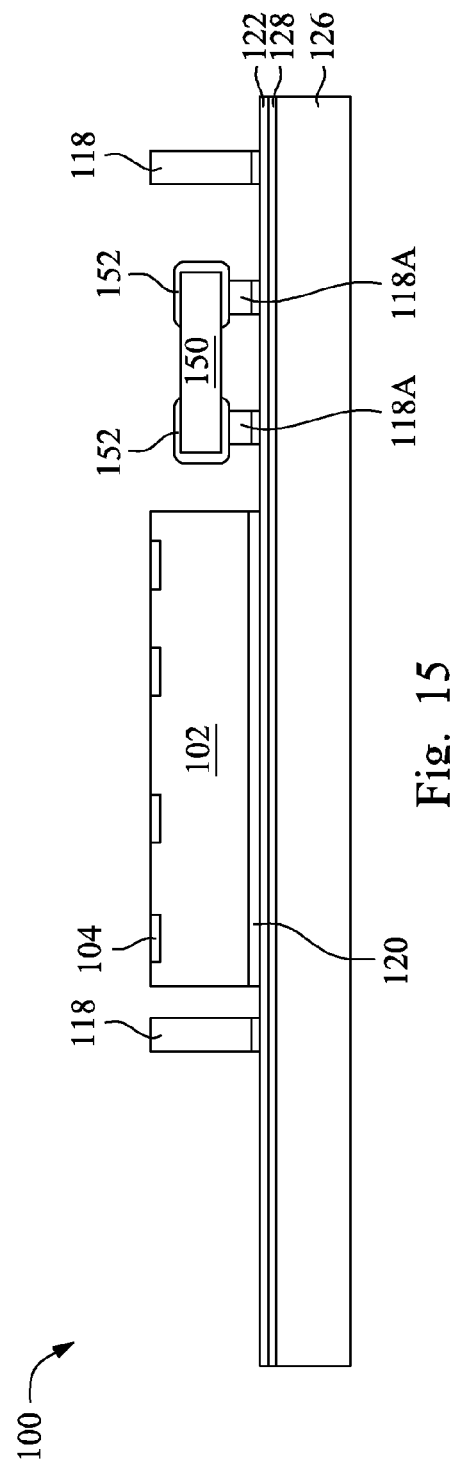

Next in FIG. 15, seed layer 130 is patterned to remove portions of seed layer 130 not covered by conductive vias 118 and 118A. The patterning of seed layer 130 may include a combination of photolithography and etching processes, for example. The resulting conductive via 118 or 118A over a remaining portion of seed layer 130 may be referred to hereinafter simply as conductive via 118 or 118A for brevity. As further illustrated by FIG. 15, die 102 is placed in an opening between conductive vias and discrete device 150 is bonded to conductive vias 118A. For example, die 102 may be attached to passivation layer 122 by adhesive layer 120 (e.g., a DAF) disposed on a backside of die 102, and contact pads 152 of discrete device 150 may be bonded to conductive vias 118A. In alternative embodiments, conductive vias 118A may be omitted, and discrete device 150 may be directly bonded to a portion of seed layer 130 or passivation layer 122.

FIG. 16 illustrates the formation of molding compound 106 between die 102, conductive vias 118, and discrete device 150. The formation of molding compound 106 may overflow die 102, conductive vias 118, and discrete device 150 so that molding compound 106 covers top surfaces of die 102, conductive vias 118, and discrete device 150. Subsequently, a planarization (e.g., CMP or other etch back technique) may be performed to expose die 102 and conductive vias 118. After planarization, top surfaces of molding compound 106, die 102, and conductive vias 118 may be substantially level. However, molding compound 106 may still cover a top surface of discrete device 150. For example, after planarization discrete device 150 may remain encased in molding compound 106. Alternatively, conductive vias 118A may have a suitable vertical dimension so that top surfaces of molding compound 106, die 102, conductive vias 118, and discrete device 150 are substantially level.

FIG. 17 illustrates the patterning of molding compound 106 to include openings 140, which exposes contact pads 152 on discrete device 150. The patterning of molding compound 106 may be performed using any suitable technique, such as laser drilling, photolithography, etching, and/or the like.

Figure 18:
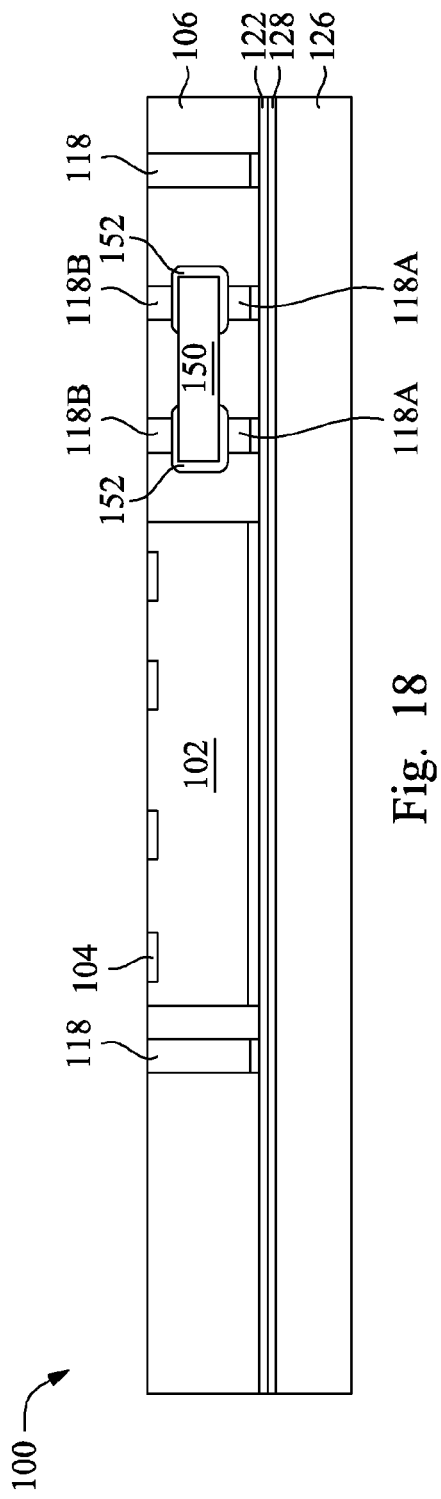

Subsequently, as illustrated by FIG. 18, openings 140 in molding compound 106 may be filled with a conductive material. For example, a seed layer (not shown) may be formed in openings 140 and a conductive material may be electrochemically plated in openings 140. Thus, various conductive vias 118B may be formed to electrically connect to contact pads 152 of discrete device 150. In some embodiments, discrete device 150 (e.g., contact pads 152 and/or internal conductive features) may electrically connect conductive vias 118B to conductive vias 118A.

Figure 19:
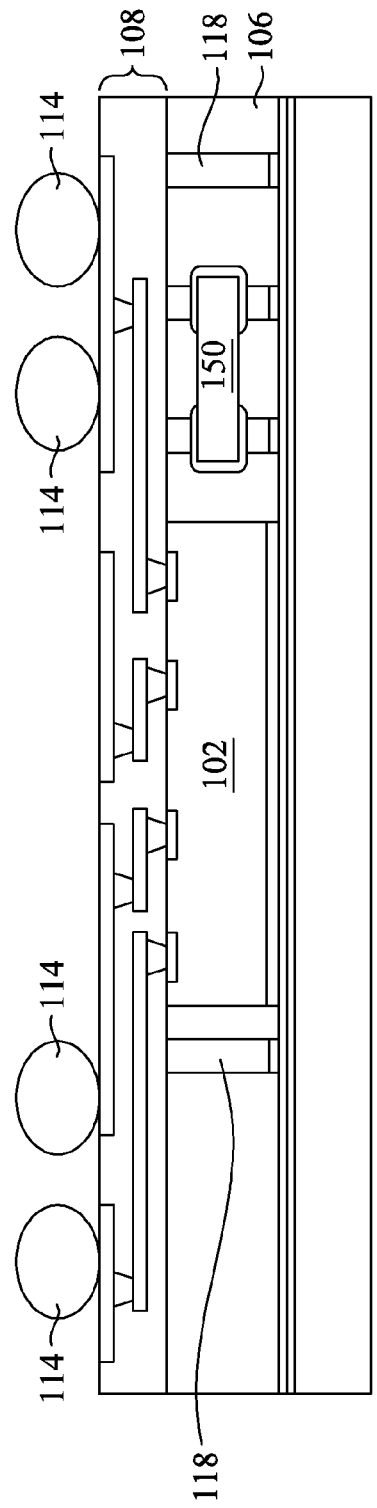

In FIG. 19, other package features, such as external connectors 116 and RDLs 108 may be formed over molding compound 106 and die 102. RDLs 108 may include conductive features 112, which may be electrically connected to dies 102, conductive vias 118, and/or discrete device 150. RDLs 108 may further electrically connect connectors 116 with dies 102, conductive vias 118, and discrete device 150. Connectors 116 may be used to electrically connect package 100 to another package component 200 (see e.g., FIG. 2).

Figure 20:
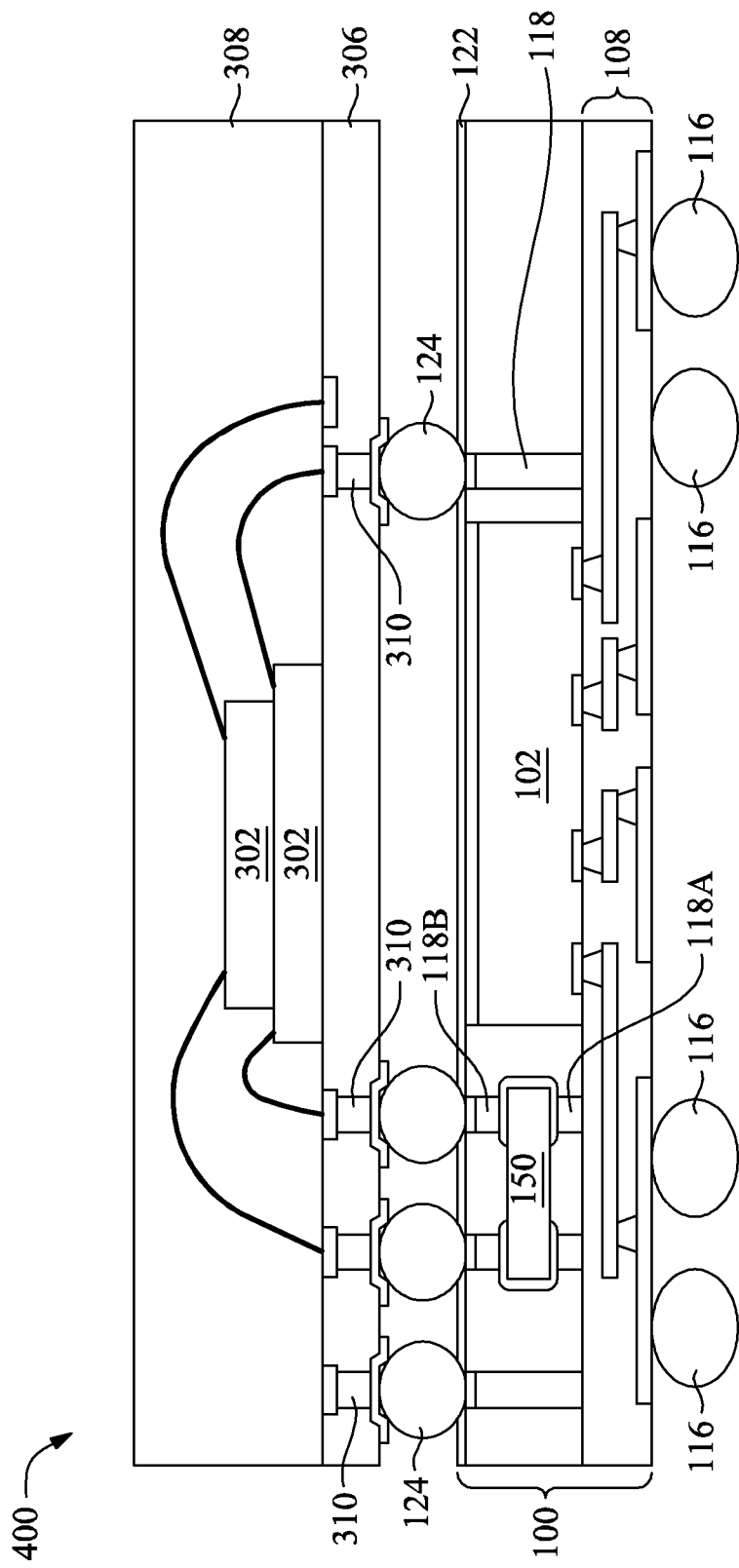

In FIG. 20, package 100 may be removed from carrier substrate 126 by removing temporary adhesive layer 128. The orientation of package 100 may then be flipped. For example, the backside of die 102 may be oriented upwards. Subsequently, passivation layer 122 is patterned to expose conductive vias 118/118B using a suitable process such as laser etching, photolithography, and/or etching, for example, and package 300 may be bonded to conductive vias 118/118B using connectors 124 (e.g., by performing a reflow). Thus, a device package 400 having discrete device 150 in molding compound 106 may be formed.

Figure 21:
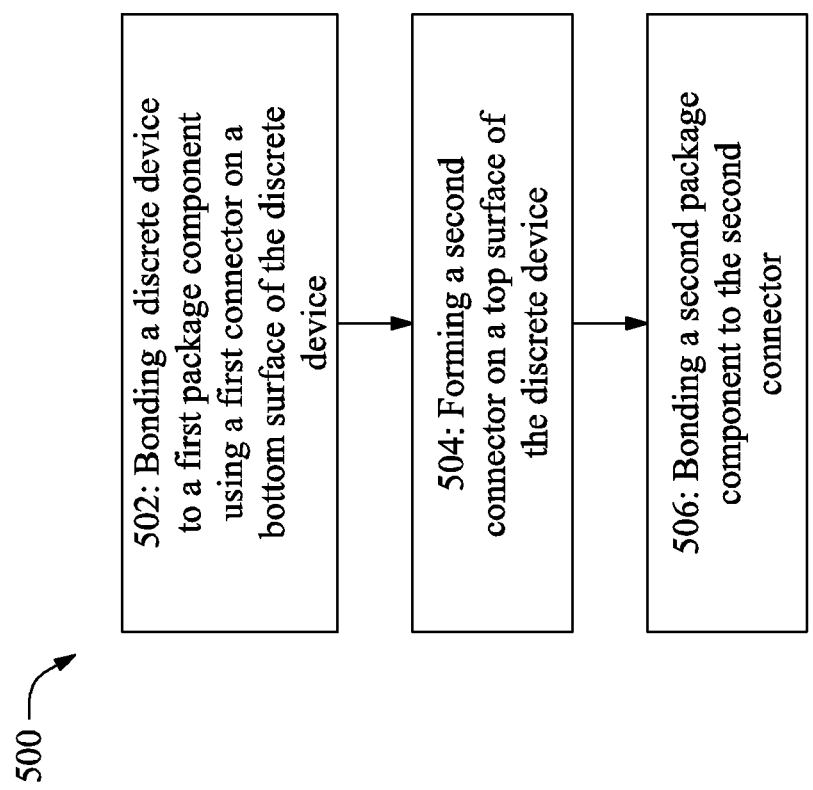
FIG. 21 illustrates a flow chart of an example process for forming a semiconductor device package in accordance with some embodiments.

FIG. 21 illustrates an example process flow 500 for forming a device package in accordance with some embodiments. In step 502, a discrete device (e.g., discrete device 150) is bonded to a first package component using a first connector on a bottom surface of the discrete device. In some embodiments, the first connector may be a solder ball (e.g., connector 154A), which may be used to bond the discrete device to a device package (e.g., package 100). In other embodiments, the first connector may be conductive via (e.g., conductive via 118A), which may be used to bond the discrete device to conductive features in one or more RDLs.

In step 504, a second connector (e.g., connector 154B or conductive via 118B) is formed on a top surface of the discrete device. The first and second connectors may be disposed on top and bottom surfaces of a single contact pad (e.g., contact pad 152), which may be disposed on a top, bottom, and sidewall surface of the discrete device. In such embodiments, the contact pad may electrically connect the first and second connectors. In other embodiments, the first and second connectors may be electrically connected by interconnect structures within the discrete device. In step 506, a second package component (e.g., package component 200, package 300, or connector 124) is bonded to the second connector.

As described above, packages having discrete devices and methods of forming such packages are described. In some embodiments, connectors may be formed on both a top and bottom surface of the discrete devices, which may be used to bond and/or electrically connect the discrete devices to package components disposed above and below the discrete devices. The discrete devices may be used as interconnect structures, thermal conductivity paths, structural supports, and/or the like to improve thermal, power, structural, and/or electrical functions of the resulting device package.

In accordance with an embodiment, a device package includes a discrete device, a first connector on a bottom surface of the discrete device, and a second connector on a top surface of the discrete device. The first connector bonds the discrete device to a first package component, and the second connector bonds the discrete device to a second package component.

In accordance with another embodiment, a device package includes a first package component, a discrete device, a first connector on a first surface of the discrete device, a second connector on a second surface of the discrete device opposite the first surface of the discrete device, and a second package component bonded to the second connector. The first package component includes a device die, a molding compound extending along sidewalls of the device die, and one or more redistribution layers electrically connected to the device die.

In accordance with yet another embodiment, a method for forming a semiconductor package includes providing a discrete device and bonding the discrete device to a first package component using a first connector on a bottom surface of the discrete device. The method further includes forming a second connector on a top surface of the discrete device and bonding a second package component to the second connector.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device package comprising:
a discrete device;
a first contact pad over a first end of the discrete device, a top surface of the first contact pad being higher than a top surface of the discrete device and a bottom surface of the first contact pad being lower than a bottom surface of the discrete device;
a first connector on the bottom surface of the first contact pad, wherein the first connector bonds the discrete device to a first package component; and
a second connector on the top surface of the first contact pad, wherein the second connector bonds the discrete device to a second package component.

2. The device package of claim 1, wherein the discrete device comprises a second contact pad over a second end of the discrete device, the second contact pad extending along a top surface, a bottom surface, and a sidewall of the discrete device in a manner that the second end of the discrete device is encapsulated by the second contact pad, the first end being opposite to the second end in a direction that is parallel to a major surface of the discrete device.

3. The device package of claim 1, wherein the first and the second connectors are solder balls, wherein the first package component is a first device package comprising a first die.

4. The device package of claim 3, wherein the second package component is an interposer, a package substrate, or a printed circuit board.

5. The device package of claim 3, wherein the second package component is a second device package comprising a second die.

6. The device package of claim 1, further comprising:
a third device die; and
a molding compound extending along sidewalls of the third device die, wherein the discrete device is disposed in the molding compound.

7. The device package of claim 6, wherein at least one of the first connector or the second connector is a conductive via, and wherein a first lateral surface of the conductive via is substantially level with a second lateral surface of the molding compound.

8. The device package of claim 6, wherein the first package component is one or more redistribution layers (RDLs) electrically connected to the third device die.

9. A device package comprising:
a first package component comprising:
a device die;
a molding compound extending along sidewalls of the device die; and
one or more redistribution layers electrically connected to the device die;
a discrete device;
a first connector on a first surface of the discrete device, wherein the first connector is bonded to a portion of the first package component, wherein the portion of the first package component is a conductive via extending through the molding compound;
a second connector on a second surface of the discrete device opposite the first surface of the discrete device; and
a second package component bonded to the second connector.

10. The device package of claim 9, wherein the discrete device comprises a contact pad contacting a top surface, a bottom surface, and a sidewall of the discrete device, wherein the first connector and the second connector are disposed on opposing surfaces of the contact pad.

11. The device package of claim 9, wherein the portion of the first package component is a conductive feature in the one or more redistribution layers.

12. The device package of claim 9, wherein the discrete device is disposed in the molding compound, and wherein the first connector is a conductive via in the molding compound.

13. The device package of claim 9, wherein the second package component is a second device package, a package substrate, an interposer, or a printed circuit board.

14. The device package of claim 9, further comprising a third connector bonding a top surface of the first package component to a bottom surface of the second package component, wherein the first connector is bonded to the top surface of the first package component, and wherein the second connector is bonded to the bottom surface of the second package component.

15. The device package of claim 9, wherein the discrete device comprises a contact pad that extends along a top surface, a side surface, and a sidewall of the discrete device in a manner that encapsulates an end of the discrete device.

16. A method for forming a semiconductor package comprising:
providing a discrete device;
bonding the discrete device to a first package component using a first connector on a bottom surface of the discrete device, wherein the first package component comprises a device die, a molding compound extending along sidewalls of the device die, and a first conductive via extending through the molding compound, wherein bonding the discrete device to the first package component comprises bonding the discrete device to the first conductive via, and wherein the first conductive via extends from the discrete device on a first surface of the molding compound to a redistribution layer on an opposite surface of the molding compound;
forming a second connector on a top surface of the discrete device; and
bonding a second package component to the second connector.

17. The method of claim 16, wherein the second connector comprises solder, and wherein bonding the second package component comprises bonding a second device package, a package substrate, an interposer, or a printed circuit board to the second connector.

18. The method of claim 16, further comprising forming a first contact pad over a first end of the discrete device in a manner that the first contact pad encapsulates the first end of the discrete device and provides a direct electrical connection from a top surface of the discrete device to a bottom surface of the discrete device.

19. The method of claim 18, further comprising forming a second contact pad over a second end of the discrete device in a manner that the second contact pad encapsulates the second end of the discrete device and provides a direct electrical connection from a top surface of the discrete device to a bottom surface of the discrete device.

20. The method of claim 16, wherein the second package component is a second device package comprising a second die.

* * * * *